United States Patent
Baik et al.

[19]

[11] Patent Number: 6,140,027
[45] Date of Patent: Oct. 31, 2000

[54] PHOTORESIST REMOVER COMPOSITION

[75] Inventors: Ji-Hum Baik, Yongin; Chang-Il Oh, Seongnam; Sang-Dai Lee, Hwasung-kun; Won-Lae Kim; Chong-Soon Yoo, both of Seoul, all of Rep. of Korea

[73] Assignee: Dongjin Semichem Co., Ltd., Incheon, Rep. of Korea

[21] Appl. No.: 09/435,569

[22] Filed: Nov. 8, 1999

[30] Foreign Application Priority Data

Dec. 31, 1998 [KR] Rep. of Korea ............... 98-63166

[51] Int. Cl.$^7$ ........................................ G03F 7/32
[52] U.S. Cl. ............................... 430/331; 510/176
[58] Field of Search .................... 430/331; 510/176

[56] References Cited

U.S. PATENT DOCUMENTS

| | | | |
|---|---|---|---|
| 4,617,251 | 10/1986 | Sizensky | 430/256 |
| 4,770,713 | 9/1988 | Ward | 134/38 |
| 5,279,771 | 1/1994 | Lee | 510/212 |
| 5,308,745 | 5/1994 | Schwartzkopf | 430/329 |
| 5,417,877 | 5/1995 | Ward | 510/176 |
| 5,472,830 | 12/1995 | Honda | 430/331 |
| 5,561,105 | 10/1996 | Honda | 510/178 |
| 5,648,324 | 7/1997 | Honda et al. | 510/176 |
| 5,795,702 | 8/1998 | Tanaba et al. | 430/331 |
| 5,849,467 | 12/1998 | Sato et al. | 430/331 |
| 6,020,292 | 2/2000 | Honda et al. | 510/175 |

FOREIGN PATENT DOCUMENTS

| | | |
|---|---|---|
| 3828513 | 1/1990 | Germany . |
| 62-49355 | 3/1987 | Japan . |
| 63-208043 | 8/1988 | Japan . |
| 63-231343 | 9/1988 | Japan . |
| 6442653 | 2/1989 | Japan . |
| 4124668 | 4/1992 | Japan . |
| 4289866 | 10/1992 | Japan . |
| 4350660 | 12/1992 | Japan . |
| 5281753 | 10/1993 | Japan . |
| 6266119 | 9/1994 | Japan . |
| 769618 | 7/1995 | Japan . |
| 8123043 | 5/1996 | Japan . |
| 8262746 | 10/1996 | Japan . |
| 996911 | 4/1997 | Japan . |
| 9152721 | 6/1997 | Japan . |

*Primary Examiner*—Hoa Van Le
*Attorney, Agent, or Firm*—Baker Botts L.L.P.

[57] ABSTRACT

A photoresist remover composition used for removing photoresist during the manufacture of semiconductor devices such as integrated circuits (IC), large-scale integrated circuits (LSI) or very large scale integrated circuits (VLSI). The photoresist remover composition includes 10~40 wt % of water-soluble amine compound; 20~50 wt % of at least one water-soluble polar organic solvent selected from the group consisting of dimetylsulfoxide (DMSO), N-methylpyrrolidone (NMP), dimethylacetamide (DMAc), dimethylformamide (DMF) and dimethylimidezolidinone (DMI); 10~30 wt % of water; 0.1~10 wt % of organic phenol compound containing two or more hydroxy groups; 0.1~10 wt % of triazole compound; and 0.01~1 wt % of silicone surfactant. Therefore, the photoresist remover composition can easily remove, at a low temperature and in a short time, a photoresist layer which has been cured during hard baking, dry etching, ashing and/or ion-implantation processes, and the potoresist layer cross-linked by a metallic contaminants shed from a lower metal layer during these processes. Also, corrosion of the lower metal pattern during the photoresist removal process can be minimized.

10 Claims, 3 Drawing Sheets

PHOTORESIST REMOVER COMPOSITION

BACKGROUND OF THE INVENTION

1. Field of the Invention

The present invention relates to a composition used to remove photoresist during the manufacture of semiconductor devices such as integrated circuits (IC), large-scale integrated circuits (LSI) or very large scale integrated circuits (VLSI), and more particularly, to a photoresist remover composition capable of easily removing, at a low temperature and in a short time, a photoresist layer which is cross-linked during hard baking, dry etching, ashing and/or ion-implantation for photolithography, which are critical processes in producing integrated circuits having a fine pattern, and the photoresist layer cross-linked by metallic contaminants which are shed from a metal layer underneath the photoresist layer during the processes, and capable of minimizing corrosion of a lower metal pattern during removal of the photoresist.

2. Description of the Related Art

In general, during the manufacturing process of semiconductor devices, a photoresist pattern is formed on a conductive layer on a semiconductor device, and then a part of the conductive layer, which is not covered with the pattern, is etched using the pattern as a mask, to form a conductive layer pattern. The photoresist pattern used as the mask should be removed from the conductive layer using a photoresist remover during a cleaning process performed after the formation of the conductive layer pattern. However, recently, semiconductor manufacturing processes have adopted a dry etching process to form a conductive layer pattern, thus removing photoresist during the cleaning process becomes difficult.

The dry etching process, opposed to a wet etching process using acidic chemical solution, is performed through a gas-solid reaction between a plasma etching gas and a material layer such as a conductive layer. The dry etching process can be easily controlled and produces a sharp pattern and thus it is currently leading trend of etching processes. However, during the etching process of the conductive layer, ions and radicals of the plasma etching gas react with the photoresist layer at the surface, so that the photoresist layer is rapidly cured. Accordingly, removing the photoresist becomes difficult.

There are many types of dry etching processes. Reactive ion etching (RIE) is one of these dry etching processes. However, in the case of using the RIE process, it is difficult to reliably remove the photoresist.

Another process which makes the removal of the photoresist difficult is the ion-implantation process. The ion-implantation process is for diffusing phosphorous, arsenic or boron ions into a specific region of a silicon wafer to produce conductivity. The ions are implanted into only a part of the silicon wafer, which is not covered with a photoresist pattern, and simultaneously the photoresist pattern used as a mask for the ion implantation is cross-linked due to a chemical cross-linking reaction with accelerated ion beams at the surface thereof. Thus, it is difficult to remove the photoresist layer after it has undergone ion implantation, by using various solvents in a cleaning process.

Thus, after the photoresist layer has undergone the dry etching or ion-implantation process it cannot be removed using a conventional photoresist remover such as phenol. Also, the cleaning process using phenol is unstable because it requires a soaking process at a high temperature of 100° C. or more for a long time, thereby increasing the failure ratio of semiconductor devices. Due to such a fact, phenolic photoresist removers have been scarcely used in production lines.

Meanwhile, a photoresist remover composition consisting of alkanol amine and diethylene glycol monoalkyl ether has been suggested recently and widely used due to its effective performance in addition to its mild odor and low toxicity. However, the photoresist remover composition cannot remove satisfactorily a photoresist layer exposed to a plasma etching gas or ion beams during the dry etching process or ion-implantation process. Thus, the need for a new photoresist remover capable of removing a photoresist layer cross-linked by dry etching and ion-implantation has increased.

In particular, in the manufacturing process of a VLSI circuit, it is very difficult to remove a photoresist layer which has undergone ion-implantation with a high dose in order to form a source/drain region. During the ion-implantation process, the surface of the photoresist layer is cured by the heat generated from the reaction due to a high dose and high energy of ion beams.

Also, in the ashing process of a semiconductor wafer, photoresist residue may be produced due to a popping phenomenon of the photoresist. The wafer is heated to a high temperature of 200° C. or higher to evaporate the solvent remaining in the photoresist. However, the surface of the photoresist layer is cross-linked after the ion-implantation with a high dose, so that it is difficult to discharge the solvent remaining in the photoresist. As the ashing is performed, the internal pressure of the photoresist layer increases and the surface of the photoresist layer pops due to the solvent existing therein, which is called popping phenomenon. As a result, the cured layer formed at the photoresist surface scatters and it is difficult to remove the resultant residue from the cured layer.

Also, in the case where the surface of the photoresist layer is cured by heat, dopants, i.e. impurities, in the cured layer are substituted for molecules in the molecular structure of photoresist, and cause cross-linking reactions, so that the substituted portion is oxidized by $O_2$ plasma. The oxidized photoresist changes to residues and particles and acts as a contaminant, thereby lowering yield in VLSI chip production.

In order to effectively remove the cured photoresist layer described above, various dry and wet cleaning processes have been suggested; a two-stage ashing process as one of those processes has been disclosed by Fujimura in a preannouncement for the Japanese Applied Physics Association in spring (1P-13, page 574, 1989). According to the two-stage ashing process, first ashing is performed by a general method, and secondary ashing is then performed. However, the dry cleaning process is very complicated and requires very large scale equipment, thereby lowering the efficiency of process.

Meanwhile, a photoresist remover composition obtained by mixing an organic amine compound and various organic solvents has been suggested as a photoresist remover for a wet cleaning process. In particular, a photoresist remover composition containing monoethanol amine (MEA) as an essential organic amine component has been widely used.

For example, two-component photoresist remover composition consisting of an organic amine compound such as MEA or 2-(2-aminoethoxy)ethanol (AEE), and a polar solvent such as N,N-dimethylacetamide (DMAc), N,N-dimethylformamide (DMF), N-methylpyrrolidone (NMP), dimethylsulfoxide (DMSO), carbitol acetate or methoxyacetoxypropane (disclosed in U.S. Pat. No. 4,617,251); a two-component photoresist remover composition consisting of an organic amine compound such as MEA, monopropanol amine or methylamylethanol, and an amide solvent such as N-methylacetamide (MAc), N,N-dimethylacetamide (DMAc), N,N-dimethylformamide (DMF), N,N-diethylacetamide (DEAc), N,N-dipropylacetamide (DPAc), N,N-dimethylpropionamide, N,N-diethylbutylamide, N-N-diethylbutylamide or N-methyl-N-ethylpropionamide (disclosed in U.S. Pat. No. 4,770,713); a two-component photoresist remover composition consisting of an organic amine compound including alkanolamine such as MEA, and a non-protonic polar solvent such as 1,3-dimethyl-2-imidazolidinone (DMI) or 1,3-dimethyl-tetrahydropyrimidinon (disclosed in German Patent Laid-Open Publication No. 3,828,513); a photoresist remover composition consisting of an alkanol amine or a polyalkylene polyamine, sulfolane or sulfone compound, and glycol monoalkylether such as diethyleneglycol monoethylether or diethyleneglycol monobutylether in a predetermined mixing ratio (disclosed in Japanese Patent Laid-Open Publication No. Sho 62-49355); a photoresist remover composition consisting of a soluble amine such as MEA or DEA and 1,3-dimethyl-2-imidazolidinone (disclosed in Japanese Patent Laid-Open Publication No. Sho 63-208043); a positive type photoresist remover composition consisting of amines such as MEA, ethylenediamine, piperidine or benzylamine, a polar solvent such as DMAc, NMP or DMSO, and a surfactant (disclosed in Japanese Patent Laid-Open Publication No. Sho 63-231343); a positive type photoresist remover composition consisting of a nitrogen-containing organic hydroxy compound such as MEA, at least one solvent selected from the group consisting of diethyleneglycol monoethyl ether, diethyleneglycol dialkylether, y-butyrolactone and 1,3-dimethyl-2-imidazolidinone, and DMSO (disclosed in Japanese Patent Laid-Open Publication No. Sho 64-42653); a positive photoresist remover composition consisting of an organic amine compound such as MEA, a non-protonic polar solvent such as diethylene glycolmonoalkyl ether, DMAc, NMP or DMSO, and a phosphoricester surfactant (disclosed in Japanese Patent Laid-Open Publication No. Heisei 4-124668); a photoresist remover composition containg water-soluble organic amine compounds such as DMI, DMSO or MEA (disclosed in Japanese Patent Laid-Open Publication No. Heisei 4-350660); and a photoresist remover composition consisting of MEA, DMSO and catechol (disclosed in Japanese Patent Laid-Open Publication No. Heisei 5-281753). In general, these disclosed photoresist remover compositions are excellent in terms of safety, working efficiency and photoresist removing performance.

However, in recent processes for manufacturing semiconductor devices, the processing conditions have become severe, e.g., a high-temperature process at 110~140° C. on various substrates including a silicon wafer, so that the photoresist is baked at a high temperature. However, the above-mentioned photoresist removers do not sufficiently remove the photoresist baked at a high temperature. Thus, a photoresist remover composition containing water and/or a hydroxylamine compound has been suggested as a composition for removing the photoresist baked at a high temperature, for example, a photoresist remover composition consisting of hydroxylamines, alkanolamines and water (disclosed in Japanese Patent Laid-Open Publication No. Heisei 4-289866), a photoresist remover composition consisting of amines, alkanolamines, water and a corrosion inhibitor (disclosed in Japanese Patent Laid-Open Publication No. Heisei 6-266119), a photoresist remover composition consisting of polar solvents such as GBL(Gamma Butyrolactone), DMF, DMAc or NMP, amino alcohols such as 2-methylaminoethanol and water (disclosed in Japanese Patent Laid-Open Publication No. Heisei 7-69618), a photoresist remover composition consisting of amino alcohols such as MEA, water and butyldiglycol (disclosed in Japanese Patent Laid-Open Publication No. 8-123043), a photoresist remover composition consisting of alkanolamines or alkoxyalkylamines, glycolmonoalkylether, sugar alcohols, a quaternary ammonium hydroxide and water (disclosed in Japanese Patent Laid-Open Publication No. Heisei 8-262746), a photoresist remover composition consisting of at least one alkanolamine selected from the group consisting of MEA and AEE, hydroxylamine, diethyleneglycolmonoalkylether, sugars (sorbitol) and water (disclosed in Japanese Patent Laid-Open Publication No. Heisei 9-152721), and a photoresist remover composition consisting of hydroxylamines, water, amines having an acid dissociation constant (pKa) of 7.5~13, a water-soluble organic solvent and a corrosion inhibitor (disclosed in Japanese Patent Laid-Open Publication No. Heisei 9-96911).

However, the above photoresist remover compositions are not enough to remove a photoresist layer which is processed by the dry etching, ashing and/or ion-implantation, and the photoresist layer cross-linked by metallic contaminants shed from the metal layer underneath the photoresist layer. Also, the anti-corrosion property of these photoresist remover compositions on the metal pattern underneath the photoresist layer during the photoresist removal process is unsatisfactory.

SUMMARY OF THE INVENTION

It is an object of the present invention to provide a photoresist remover composition capable of easily removing, at a low temperature and in a short time, a photoresist layer which is cured by dry-etching, ashing and/or ion implantation, and the photoresist layer cross-linked by metallic contaminants which are shed from a metal layer formed underneath the photoresist layer, and capable of minimizing corrosion of the metal pattern during removal of the photoresist.

To achieve the object of the present invention, there is provided a photoresist remover composition comprising:
  10~40 wt % of water-soluble amine compound;
  20~50 wt % of at least one water-soluble polar organic solvent selected from the group consisting of dimetylsulfoxide (DMSO), N-methylpyrrolidone (NMP), dimethylacetamide (DMAc), dimethylformamide (DMF) and dimethylimidezolidinone (DMI);
  10~30 wt % of water;
  0.1~10 wt % of organic phenol compound containing two or more hydroxy groups;
  0.1~10 wt % of triazole compound; and
  0.01~1 wt % of silicone surfactant.

Preferably, the water-soluble organic amine compound is an amino alcohol compound.

Preferably, the amino alcohol compound is at least one selected from the group consisting of 2-amino-1-ethanol,

1-amino-2-propanol, 2-amino-1-propanol, 3-amino-1-propanol, 2-amino-1-butanol and 4-amino-1-butanol.

Preferably, the organic phenol compound containing two or more hydroxy groups is a bisphenol compound expressed as the following chemical formula (1):

(1)

wherein $R_1$s are independently selected from $C_1$ to $C_4$ alkyl or $C_1$ to $C_4$ alkoxy; $R_2$s are independently selected from hydrogen, $C_1$ to $C_4$ alkyl or $C_1$ to $C_4$ alkoxy; $m_1$ and $m_2$ are integers from 1 to 3; and $n_1$ and $n_2$ are integers from 0 to 3.

Preferably, the organic phenol compound containing two or more hydroxy groups is a hydroxybenzophenone compound expressed as the following chemical formula (2):

(2)

wherein $R_1$s are independently selected from $C_1$ to $C_4$ alkyl or $C_1$ to $C_4$ alkoxy; $m_1$ and $m_2$ are integers from 1 to 3; and $n_1$ and $n_2$ are integers from 0 to 3.

Preferably, the organic phenol compound containing two or more hydroxy groups is a trisphenol compound expressed as the following chemical formula (3):

(3)

wherein $R_1$s are independently selected from $C_1$ to $C_4$ alkyl or $C_1$ to $C_4$ alkoxy; $R_2$ is hydrogen, $C_1$ to $C_4$ alkyl or $C_1$ to $C_4$ alkoxy; $m_1$ through $m_3$ are integers from 1 to 3; and $n_1$ through $n_3$ are integers from 0 to 3.

Preferably, the organic phenol compound containing two or more hydroxy groups is a compound expressed as the following chemical formula (4):

(4)

wherein $R_1$s are independently selected from $C_1$ to $C_4$ alkyl or $C_1$ to $C_4$ alkoxy; $R_2$, $R_3$ and $R_4$ are each independently selected from $C_1$ to $C_4$ alkyl or $C_1$ to $C_4$ alkoxy; $m_1$ through $m_3$ are integers from 1 to 3; and $n_1$ through $n_3$ are integers from 0 to 3.

Preferably, the organic phenol compound containing two or more hydroxy groups is a compound expressed as the following chemical formula (5):

(5)

wherein $R_1$s are independently selected from $C_1$ to $C_4$ alkyl or $C_1$ to $C_4$ alkoxy; k is an integer from 0 to 3; $m_1$ through $m_7$ are integers from 1 to 3; and $n_1$ through $n_4$ are integers from 0 to 3.

Preferably, the triazole compound is at least one selected from the group consisting of benzotriazole (BT), tolyltriazole (TT), carboxylic benzotriazole (CBT), 1-hydroxybenzotriaxole (HBT) and nitrobenzotriazole (NBT).

Preferably, the silicone surfactant is a compound expressed as the following chemical formula (6):

(6)

wherein x is an integer from 0 to 10, y is an integer from 1 to 10, m is an integer from 0 to 10, n is an integer from 1 to 10, EO represents ethyleneoxy group, PO represents 1,2-propyleneoxy group, and Z represents halogen or alkyl group.

The photoresist remover composition according to the present invention can easily remove, at a low temperature and in a short time, the photoresist layer which is cured by dry etching, ashing and/or ion implantation, and metallic contaminants which are shed from the metal layer underneath the photoresist layer. Also, during removal of the photoresist, corrosion of the lower metal pattern, in particular, side pitting of the lower metal pattern, can be minimized. In addition, even when a specimen is soaked in the photoresist remover composition for a long time, there is less precipitation of the photoresist dissolved in the photoresist remover composition, so that less photoresist is redeposited on the surface of a substrate. Also, in the following process of rinsing only water may be used without the need for an organic solvent such as isopropyl alcohol or dimethylsulfoxide.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENTS

The water-soluble organic amine compound of the photoresist remover composition according to the present invention is an amino alcohol. Preferably, the water-soluble organic amine compound is at least one selected from the group consisting of 2-amino-1-ethanol, 1-amino-2-propanol, 2-amino-1-propanol, 3-amino-1-propanol, 2-amino-1-butanol and 4-amino-1-butanol. In particular, 2-amino-1-ethanol is more preferable in consideration of photoresist removal efficiency and costs.

The content of the water-soluble organic amine compound is 10~40 wt %, preferably 20~30 wt %. That is, if the content of the water-soluble organic amine compound is less than 10 wt %, it is difficult to completely remove the photoresist which has cross-linked during the preceding dry etching and/or ion implantation process. If the content of the water-soluble organic amine compound exceeds 40 wt %, there is a problem where the metal pattern underneath the photoresist layer greatly corrodes.

The water-soluble polar organic solvent of the photoresist remover composition according to the present invention is at least one selected from the group consisting of dimethylsulfoxide (DMSO), N-methylpyrrolidone (NMP), dimethylacetamide (DMAc), dimethylformamide (DMF) and dimethylimidazolidinone (DMI).

In particular, a water-soluble polar organic solvent having a dipole moment of 3.0 or higher, preferably 4.0 or higher, may be used. The dipole moment indicates the polarity of solvent, wherein the higher the dipole moment is, the greater the polarity of solvent. Water-soluble organic solvents having a dipole moment of 3.0 or higher are shown in TABLE 1. As shown in TABLE 1, DMSO, NMP and DMI have a dipole moment higher than 4.0. As the dipole moment of the water-soluble polar organic solvent becomes higher, the photoresist removal efficiency and dissolving ability of the photoresist remover composition are improved. Also, the water-soluble polar organic solvent can be easily mixed with the water-soluble organic amine compound. In addition, the water-soluble organic solvent has a boiling point of 150° C. or higher, preferably 180° C. or higher, in consideration of volatility.

Water-soluble polar organic solvents satisfying the above conditions are shown in TABLE 1. Water-soluble polar organic solvents of TABLE 1 have very high affinity to water, so that they can allow the photoresist remover composition to stably remove the photoresist. After the photoresist removal process, the remover composition remaining on the substrate can be removed using ultrapure water, instead of using an organic solvent, in the rinsing process. Also, because the soluble polar organic solvents have less effect on the corrosion of the metal pattern, the effect of a trace of remaining polar solvent on a finished semiconductor device is negligible.

TABLE 1

|  | DMSO | NMP | DMI | DMF | DMAc |
|---|---|---|---|---|---|
| Dipole moment | 4.3 | 4.09 | 4.05 | 3.86 | 3.79 |
| Boiling point, ° C. | 189 | 202 | 225 | 153 | 166 |

The content of the water-soluble organic solvent is 20~50 wt %, preferably 25~45 wt %. As the dipole moment of the water-soluble polar organic solvent becomes higher, the solubility parameter thereof increases, thereby enhancing the solubility of a polymer resin contained in the photoresist composition. In particular, it has been found that the water-soluble organic solvents have excellent dissolving ability of the major part of the photoresist layer which has been unchanged during the preceding processes. If the content of the water-soluble polar organic solvent is less than 20 wt %, the solubility to the photoresist layer which has undergone dry etching and ion implantation processes is lowered. Here, the upper limit of 50 wt % in the content of the water-soluble polar organic solvent is set in consideration of the mixing ratio with other components.

Another component of the photoresist remover composition according to the present invention is water. Preferably, the water is purewater filtered through ion exchange resin, and more preferably ultrapure water having a resistivity of 18MΩ is used.

In the photoresist remover composition according to the present invention, preferably, the content of water is 10~30 wt %, and more preferably, 15~25 wt %. If the content of water is less than 10 wt %, the removal efficiency on the photoresist, which has been significantly cross-linked by metallic contaminants produced during the dry etching and ashing processes, is lowered. However, if the content of water exceeds 30 wt %, it is likely that the lower metal pattern will corrode during the photoresist removal process. Also, because the contents of the water-soluble organic amine compound and the water-soluble polar organic solvent relatively decrease, the removal efficiency with respect to the part of the photoresist layer which is not cross-linked, which is the major part of the photoresist layer, is lowered. It has been found through experimentation that the most desirable range of the water content is 10~30 wt %.

In the photoresist remover composition according to the present invention, an organic phenol compound having two or more hydroxy groups acts as an accelerator for removal of the photoresist, and is selected from the group consisting of compounds expressed as the chemical formulae (1) through (5).

In each of the chemical formulas (1) through (5), $R_1$s are independently selected from $C_1$ to $C_4$ alkyl or $C_1$ to $C_4$ alkoxy; $R_2$s are independently selected from hydrogen, $C_1$ to $C_4$ alkyl or $C_1$ to $C_4$ alkoxy; $R_3$ and $R_4$ are independently selected from $C_1$ to $C_4$ alkyl or $C_1$ to $C_4$ alkoxy; k is an integer from 0 to 3; $m_1$ through $m_7$ are integers from 1 to 3; and $n_1$ through $n_4$ are integers from 0 to 3. Preferably, $R_1$ is a $C_1$ to $C_4$ alkyl; $R_2$ through $R_4$ are a $C_1$ to $C_4$ alkyl; k and $m_1$ through $m_7$ are 1; and $n_1$ through $n_4$ are 0 or 1.

As the result of various research, it has been found that an organic phenol compound containing two or more hydroxy groups shows excellent photoresist removal efficiency at a low temperature as opposed to cresol, xylenol, resorcinol and salicylic aldehyde which have less than 2 hydroxy groups. The organic phenol compound may be, for example, a bisphenol such as 2,4'-methylenebisphenol, bisphenol A, bisphenol C, bisphenol E, bisphenol F, bisphenol AP, bisphenol M, bisphenol P, 1,1'-bis(4-hydroxyphenyl)cyclopentane, 9,9'-bis(4-hydroxyphenyl)fluorene, 1,1'-bis(5-methyl-2-hydroxyphenyl)methane,
3,5-dimethyl-4-hydroxybenzylphenol or 4,4'-dihydroxybenzophenone; a trisphenol such as 1,1,1-tris (4-ydroxyphenyl)methane, 1,1,1,-tris(4-hydroxyphenyl) ethane,
1,1-bis(3-methyl-4-hydroxyphenyl)-1-(4-hydroxyphenyl) methane,
1,1-bis(2,5-dimethyl-4-hydroxyphenyl)-1(2-hydroxyphenyl)methane,
1,1-bis(3,5-methyl-4-hydroxyphenyl)-1-(2-hydroxyphenyl) methane,
2,6-bis(5-methyl-2-hydroxybenzyl)-4-methylphenol,
2,6-bis(4-hydroxybenzyl)-4-methylphenol,
2,6-bis(3-methyl-4-hydroxybenzyl)-4-methylphenol,
2,6-bis(3,5-dimethyl-4-hydroxybenzyl)-4-methylphenol or trisphenol-TC; a tetrakisphenol such as 1,1,2,2-tetrakis(4-hydroxyphenyl)ethane,
1,1,2,2-tetrakis(3-methyl-4-hydroxyphenyl)ethane,
1,1,3,3-tetrakis(4-hydroxyphenyl)propane, 1,1,5,5-tetrakis (4-hydroxyphenyl)pentane,
α,α,α',α'-tetrakis(4-hydroxyphenyl)-3-xylene,
α,α,α',α'-tetrakis(4-hydroxyphenyl)-4-xylene,
α,α,α',α'-tetrakis(3-methyl-4-hydroxyphenyl)-3-xylene or α,α,α',α'-tetrakis(3-methyl-4-hydroxyphenyl)-4-xylene; a hydroxybenzophenon such as 2,3,4-trihydroxybenzophenone, 2,4,4'-trihydroxybenzophenone,
2,3,4,4'-tetrahydroxybenzophenone, 2,2',3,3',4-pentahydroxybenzophenone or 2,2',3,3',4,4'-hexahydroxybenzophenone; or
1-[1'-methyl-1'-(4'-hydroxyphenyl)ethyl]-4-[1',1'-bis-(4-hydroxyphenyl)ethyl]benzene,
2,6-bis(2'-hydroxy-5'-methylphenylethyl)-4-methyl-1-hydroxybenzone, etc.

The organic phenol compound having two or more hydroxy groups, an essential component required to remove a photoresist layer which has been cross-linked by the dry etching, ashing and/or ion-implantation processes, and which has been cross-linked by a metallic contaminants which has been shed from the lower metal layer during these processes, assists hydroxy ions produced by a reaction between the water-soluble organic amine compound and hydrogen ions of water, in effectively penetrating into the interface between the photoresist layer and a semiconductor substrate. Also, the organic phenol compound containing two or more hydroxy groups has an anti-corrosion effect where the lower metal layer is protected from corrosion due to the hydroxy ions generated from the photoresist remover composition.

In the photoresist remover composition according to the present invention, preferably, the content of the organic phenol compound having two or more hydroxy groups is 0.1~10 wt %, and more preferably 0.5~5 wt %. If the content of the organic phenol compound is less than 0.1 wt %, the removal efficiency at a low temperature on a photoresist layer which has been greatly cross-linked by a metallic byproduct generated after the dry etching and ion-implantation processes, is deteriorated, and corrosion of the lower metal layer becomes serious. If the content of the organic phenol compound exceeds 10 wt %, the removal efficiency is uneconomic in consideration of the production cost of the photoresist remover composition.

In the photoresist remover composition according to the present invention, a triazole compound contribute to the anti-corrosion property of the composition.

The organic phenol compound having two or more hydroxy groups gives a reliable anti-corrosion property to the photoresist removal composition. However, the organic phenol compound is not enough to prevent partial corrosion, i.e., the pitting phenomenon, at the sides or the top of the lower metal pattern. According to the result of research which has been performed to solve this problem, such a pitting phenomenon can be prevented by mixing the organic phenol compound having two or more hydroxy groups with a triazole compound. In particular, in the case where a triazole compound as an anti-corrosion agent is mixed with an aromatic phenol compound containing hydroxy groups in an appropriate ratio, there is a synergic effect in preventing the pitting at the sidewalls of the photoresist layer. The triazole compound may be used as an anti-corrosion agent includes, for example, benzotriazole (BT), tolyltriazole (TT), carboxylic benzotriazole (CBT), 1-hydroxybenzotriazole (HBT) or nitrobenzotriazole (NBT).

In the photoresist remover composition according to the present invention, preferably the content of the triazole compound is 0.1~10 wt %, and more preferably 0.5~5 wt %. If the content of the triazole compound is less than 0.1 wt %, anti-pitting ability is negligible. Meanwhile, if the content of the triazole compound exceeds 10 wt %, the viscosity of the photoresist remover composition increases, so that the usability is lowered.

In the photoresist remover composition according to the present invention, the last component is a silicone surfactant. Preferably, the silicone surfactant is a compound expressed as the following chemical formula (6).

(6)

Wherein x is an integer from 0 to 10, y is an integer from 1 to 10, m is an integer from 0 to 10, n is an integer from 1 to 10, EO represents an ethyleneoxy group, PO represents an 1,2-propyleneoxy group, and Z represents a halogen or alkyl group.

It is essential to choose a surfactant capable of being easily dissolved in other components of the photoresist remover composition, i.e., the water-soluble organic amine compound, the water-soluble polar organic solvent and the water. According to the results of research, the silicone surfactant expressed as the chemical formula (6) among other surfactants which have been investigated, is desirable in the aspect that a decrease in surface tension and redeposit of the photoresist can be prevented. Meanwhile, fluorine surfactants which have been widely used in conventional photoresist remover compositions have a significant defect of low solubility in the photoresist remover composition according to the present invention even though they show excellent surface activity. That is, if the fluorine surfactant is dissolved in water, impurities or residues are generated.

However, all the silicone surfactants expressed as the chemical formula (6) show a high solubility in the water, the water-soluble organic amine compound and the water-soluble polar organic solvent in addition to having excellent surface activity, without causing the above problem. Also, unlike the conventional polyethyleneglycol surfactant, the redeposition of the photoresist can be effectively prevented by the silicone surfactants according to the present invention.

The redeposition of the photoresist refers to when the photoresist dissolved in the photoresist remover composition sticks to a semiconductor substrate after the photoresist remover composition has been used for a long time, so that the photoresist is rarely removed from the semiconductor substrate, and is one of the major reasons causing difficulty in removing photoresist.

In the photoresist remover composition according to the present invention, the surfactant decreases the surface tension at the interface between the photoresist remover composition and an aluminum (Al) doped lower metal layer made of silicon (Si), copper (Cu), titanium (Ti) or tungsten (W), such that the photoresist remover composition easily penetrates into the spaces and corners of fine patterns formed in the lower metal layer. In the case where the size of patterns is relatively large, the role of this surfactant is not important. However, as demand for fine patterns has increased, the role of the surfactant has been emphasized. That is, the surfactant decisively affects yield of semiconductor devices.

In the photoresist remover composition according to the present invention, preferably, the content of the silicone surfactant is 0.01~1 wt %. If the content of the silicone surfactant is less than 0.01 wt %, removing metal oxide stuck to the sides of the fine patterns is difficult, because of unsatisfactory surface activity. If the content of the silicone surfactant exceeds 1 wt %, the increase in preventing redeposition of the photoresist is negligible. Thus, the most effective content of the silicone surfactant in the photoresist remover compositions according to the present invention is 0.01~1 wt %.

A method for removing a photoresist qlayer which has been used as a mask in the precedent photolighotraphy process, using the photoresist remover composition according to the present invention, will now be described.

Removal of photoresist from a substrate using the photoresist remover composition according to the present invention comprises contacting the substrate deposited with photoresist, and the photoresist remover composition according to the present invention by a general method. For example, such contact can be achieved by soaking the substrate in the photoresist remover composition, or by spraying the substrate with the photoresist remover composition, and other methods can be used.

In general, the conventional photoresist remover composition shows a satisfactory photoresist removal efficiency at a temperature of 80° C. or higher. Meanwhile, the photoresist remover composition according to the present invention is characterized in that its photoresist removal efficiency is satisfactory at a low temperature in the range of 20~50° C. Thus, by using the photoresist remover composition according to the present invention, energy consumption and the amount of evaporated remover composition (i.e. consumption of the remover composition) during the photoresist removal process can be reduced, and hazards to the health of an operator due to an evaporated organic solvent can be reduced.

Types of photoresist which can be applied to the photoresist remover composition according to the present invention may be, for example, positive type photoresist, negative type photoresist, or negative and positive type photoresist. The positive type photoresist composition includes: a composition consisting of Novolak phenol resin and a naphthoquinondiazide compound; a composition consisting of a photoacid generator for generating acid through exposure to light, a compound which becomes more soluble in an alkaline solution after the compound has been decomposed by acid, and an alkali-soluble resin; and a composition consisting of a photoacid generator for generating acid through exposure to light, and an alkali-soluble resin containing a functional group which becomes more soluble in an alkaline solution after the functional group has been decomposed by acid. Also, the negative type photoresist composition may consist of a photoacid generator for generating acid through exposure to light, a cross-linking agent and an alkali-soluble resin. Among the above photoresist compositions, an effective photoresist composition is the positive type photoresist composition consisting of Novolak phenol resin and a naphthoquinondiazide compound.

Hereinafter, the present invention will be described in detail in the following examples. However, these examples are merely illustrative and the present invention is not limited to those examples. If there is no mention of units in the following examples, percentage and mixing ratio used in the examples are expressed by weight. In the following examples and comparative examples, the performance of the photoresist remover compositions was measured by the following methods.

(1) Photoresist Removal Efficiency

Preparation of Specimen A

A positive type photoresist composition (Product No. DPR-2053, manufactured by Dong-jin chemical industry Co., Korea) consisting of Novolak resin and a naphthoquinondiazide compound as a photosensitizer was spin-coated on the surface of a 5-inch silicon wafer on the bottom of which an aluminum layer had been deposited, until the final thickness of the photoresist layer reached 1.6 $\mu$m. Then, the photoresist layer was pre-baked on a hot plate at 100° C. for 90 seconds. Then, a mask having a predetermined pattern was placed on the photoresist layer and exposed to ultraviolet rays, and then developed with 2.38% of tetramethylammonium hydroxide (TMAH) developing solution (Product No. DPD-100S, manufactured by Dong-jin chemical industry Co., Korea) at 21° C. for 60 seconds. The specimens on which the photoresist pattern was formed were hard-backed on hot plates at 140° C., 160° C. and 180° C., respectively, for 300 seconds, and named A-14, A-16 and A-18, respectively.

Preparation of Specimen B

The lower aluminum layer was etched using the photoresist pattern formed on the specimen A-14, A-16 and A-18 as a mask, a single handling type dry etching apparatus (P/5000, manufactured by Applied Materials Inc., U.S.A.), and $CF_4/O_2$ etching gas, resulting in a metal pattern. Here, the conditions for dry etching were set to form an organic metal, i.e., oxymetallic polymer. The ashing process was performed using an ashing apparatus (TCA-2400, manufactured by Tokyo Ohka Kogyo Co., LTD, Japan) and an $O_2/N_2$ gas mixture as a reaction gas, to remove the upper part of the photoresist layer. Then, the resulting specimens were named B-14, B-16 and B-18, respectively. The conditions for the dry etching and ashing processes were as follows.

| [Conditions for dry etching] | |
| --- | --- |
| Etching gas: | $CF_4/O_2$ gas mixture |
| Gas flow rate: | 200 sccm |
| Pressure: | 20 mTorr |
| RF power: | 400 W |
| Magnetic field strength: | 140 Gauss |
| Stage temperature: | 20° C. |
| Etching time: | 300 sec |
| [Conditions for ashing] | |
| Reaction gas: | $O_2/N_2$ gas mixture |
| Gas flow rate: | 950/50 sccm |
| Pressure: | 5 mTorr |
| Microwave power: | 1 kW |
| Wafer temperature: | 200° C. |
| Ashing time: | 120 sec/wafer |

Preparation of Specimen C

As dopant was implanted into the entire surface of the specimen with 10 keV of acceleration energy at a dose of $1\times10^{16}$ ions/cm$^2$. Here, the ion implantation angle was 0°. That is, the ion implantation was performed at a right angle with respect to the substrate surface. Then, the specimen was moved into an ashing apparatus (TCA-2400, manufactured by Tokyo Ohka Kogyo Co., LTD, Japan) adopting a microwave downstream method, and ashing was performed using the $O_2/N_2$ gas mixture as a reaction gas under the following conditions to remove only the upper part of the photoresist layer. The resulting specimens were named C-14, C-16 and C-18.

| [Conditions for ashing] | |
| --- | --- |
| Reaction gas: | $O_2/N_2$ gas mixture |
| Gas flow rate: | 950/50 sccm |
| Pressure: | 5 mTorr |
| Microwave power: | 1 kW |
| Water temperature: | 200° C. |
| Ashing time: | 120 sec/wafer |

Photoresist Removal Test

The specimens A, B and C were soaked in both 25° C. and 50° C. photoresist remover compositions for 3 minutes. Subsequently, the specimens were taken out of the photoresist remover compositions, washed with ultrapure water and dried using $N_2$ gas. It was checked whether photoresist residues stuck to the surrounding of a via hole pattern and to the surface of the line pattern using a scanning electron microscope (SEM), and the photoresist removal efficiency was evaluated. The results are tabulated in TABLE 3 and TABLE 4. In TABLEs 3 and 4, the following legends are used to indicate anti-corrosion performance.

○: the case where the photoresist residue was completely removed from the surrounding of the via hole pattern and the surface of the line pattern;

Δ: the case where about 80% of the photoresist residue was removed from the surrounding of the via hole pattern and the surface of the line pattern; and X: the case where most of the photoresist residue remained on the surrounding of the via hole pattern and the surface of the line pattern.

(2) Anti-corrosion Test with Respect to Metal Pattern

Preparation of Specimen D-12

A positive type photoresist composition (Product No. DPR-2053, manufactured by Dong-jin chemical industry Co., Korea) consisting of Novolak resin and a naphthoquinondiazide compound as a photosensitizer was spin-coated on the surface of a 5-inch silicon wafer on the bottom of which an aluminum layer having a thickness of 10,000 Å, had been deposited until the final thickness of the photoresist layer reached 1.6 $\mu$m.

Then, the photoresist layer was pre-baked on a hot plate at 100° C. for 90 seconds. Then, a mask having a predetermined pattern was placed on the photoresist layer and exposed to ultraviolet rays, and then developed with 2.38% of tetramethylammonium hydroxide (TMAH) developing solution (Product No. DPD-100S, manufactured by Dong-jin chemical industry Co., Korea) at 21° C. for 60 seconds.

The specimen on which the photoresist pattern had been formed was hard-backed on a hot plate at 120° C. for 300 seconds.

The part of the lower aluminum layer not covered by the photoresist pattern was etched using the photoresist pattern formed through the above process as a mask, a single handling type dry etching apparatus (P/5000, manufactured by Applied Materials Inc., U.S.A.), and $CF_4/O_2$ etching gas, resulting in a metal pattern. Here, the conditions for dry etching were set so as not to form an organic metal. The ashing process was performed using an ashing apparatus (TCA-2400, manufactured by Tokyo Ohka Kogyo Co., LTD, Japan) and a $O_2/N_2$ gas mixture as a reaction gas, to remove upper part of the photoresist layer. Then, the resulting specimen was named D-12.

Anti-corrosion Test with Respect to Metal Pattern

The specimens D-12 were soaked in the photoresist remover composition at 50° C. for 10 minutes, 2 hours and 24 hours, respectively. Then, the specimens were taken out of the photoresist remover composition, washed with ultra pure water and dried using $N_2$ gas. The surrounding of a via hole pattern and the surface of the aluminum pattern line were carefully inspected using a SEM, and the degree of corrosion was evaluated. The results are tabulated in TABLE 5.

In TABLE 5, the following legends are used to indicate anti-corrosion performance.

⊚: the case where none of the sides or surface of the aluminum pattern line were corroded;

○: the case where only the sides of the aluminum pattern line were partially corroded;

Δ: the case where the sides and the surface of the aluminum pattern line were partially corroded; and X: the case where the sides and the surface of the aluminum pattern line were seriously corroded.

(3) Metal Ion Elution

20 Specimens of D-12 were soaked in 20 kg of photoresist remover compositions at 50° C. Then, the photoresist remover compositions were kept at the same temperature and sampled at points in time, 12 hours, 24 hours and 48 hours, after soaking. Then, the amount of aluminum ions eluted from the lower aluminum pattern of the specimens D-12 was measured by attaching an electro thermal vaporizer (ETV) to an inductively coupled plasma-mass spectroscopy (ICP-MS, ELAN 6000, manufactured by Perkin-Elmer Corporation, U.S.A.). The results are tabulated in TABLE 6.

(4) Photoresist Redeposition Test

While the temperature of 20 kg of the photoresist remover compositions prepared in Example 7 and Comparative Example 3 was maintained at 50° C., the photoresist removal efficiency test was performed by incrementing the number of specimens of B-14 and C-14 from one sheet to 100, 200, 300 and 400 sheets, and one specimen was taken out of each batch to investigate how much photoresist was redeposited on the substrate during the removal of photoresist. The specimens taken out of the batches were washed with ultrapure water and dried using $N_2$ gas. Then, the number of residue particles redeposited on the substrate was counted using a surface inspection apparatus (WIS-850, manufactured by Canon Co., Japan). The results are shown in TABLE 7.

EXAMPLES 1 THROUGH 9 AND COMPARATIVE EXAMPLES 1 THROUGH 7

Each component was mixed in a ratio shown in TABLE 2 to prepare photoresist remover compositions of Examples 1 through 9 and Comparative Examples 1 through 7. Then, the above-described tests, i.e., the photoresist removal efficiency test, the anti-corrosion test with respect to metal pattern, the metal ion elution test and the photoresist redeposition test, were performed on the prepared photoresist remover compositions. The results are shown in TABLEs 3 through 7.

TABLE 2

Composition of photoresist remover compositions

Composition of photoresist removal composition (wt %)

| Example | Organic amine compound | Polar organic solvent | Water | Organic phenol compound having two or more hydroxy groups | Triazole compound | Silicone surfactant | Hydroxylamine |
|---|---|---|---|---|---|---|---|
| Example 1 | MIPA (25) | DMSO (35) | (29.9) | Compound of formula 7 (8) | BT (2) | L-7604 (0.1) | (—) |
| Example 2 | MTPA (15) | DMF (50) | (29.5) | Compound of formula 8 (3.5) | BT (1.5) | L-7600 (0.5) | (—) |
| Example 3 | MIPA (25) | DMSO (47) | (22.95) | Compound of formula 9 (2.5) | BT (2.5) | L-7600 (0.05) | (—) |
| Example 4 | MEA (20) | NMP (47) | (29.9) | Compound of formula 9 (2) | TT (1) | L-7230 (0.1) | (—) |
| Example 5 | MEA (35) | DMI (25) | (29) | Compound of formula 10 (5) | TT (5) | L-7230 (1) | (—) |

TABLE 2-continued

Composition of photoresist remover compositions

| Example | Organic amine compound | Polar organic solvent | Water | Organic phenol compound having two or more hydroxy groups | Triazole compound | Silicone surfactant | Hydroxylamine |
|---|---|---|---|---|---|---|---|
| Example 6 | MEA (30) | DMSO (50) | (14.8) | Compound of formula 11 (2) | BT (3) | L-7604 (0.2) | (—) |
| Example 7 | MEA (40) | DMSO (30) | (24.9) | Compound of formula 12 (4) | CBT (1) | L-7614 (0.1) | (—) |
| Example 8 | MEA (40) | DMSO (30) | (24.9) | Compound of formula 12 (4) | CBT (1) | L-7614 (0.1) | (—) |
| Example 9 | MEA (30) | DMSO (47) | (12.9) | Compound of formula 12 (2) | CBT (8) | L-720 (0.1) | (—) |
| Comparative Example 1 | MEA (10) | MFDG (22) | (43) | (—) | BT (3) | X-100 (2) | 20 |
| Comparative Example 2 | MEA (15) | EC (30) | (25) | (—) | TT (5) | (—) | 25 |
| Comparative Example 3 | MEA (3) | DMAc (96.5) | (—) | (—) | (—) | NP-15 (0.5) | (—) |
| Comparative Example 4 | AEE (70) | MF (15) | (8) | m-C (2) | (—) | PEG (5) | (—) |
| Comparative Example 5 | MEA (60) | BC (30) | (5) | (—) | (—) | 1,4-BD (5) | (—) |
| Comparative Example 6 | MEA (60) | BC (20) | (5) | (—) | BT (10) | 1,4-BD (5) | (—) |
| Comparative Example 7 | MEA (40) | EC (30) | (26) | SA (4) | (—) | (—) | (—) |

Note 1:
Figures in parenthesis represent the amount of compound.

Note 2:
Abbreviations are for the following compounds: MIPA for monoisopropanolamine; MEA for monoethanolamine; AEE for aminoethoxyethanol; DMSO for dimethylsulfoxide; DMF for dimethylformamide; NMP for N-methylpyrolidone; DMI for dimethylimidazolidinone; DMAc for dimethylacetamide; MFDG for dipropyleneglycolmonoethylether; EC for ethylcarbitol; BC for butylcarbitol; MF for methylformamide; BT for benzotriazole (COBRATEC 99, manufactured by PMC); TT for tolyltriazole (COBRATEC TT-100, manufactured by PMC); CBT for carboxybenzotriazole; X-100 for ethylene glycol non-ionic surfactant (manufactured by Rohm & Hass Co.); NP-15 for ethylene glycol non-ionic surfactant (manufactured by Dongnam ??? Co.); PEF for polyethyleleglycol; 1,4-BD for 1,4-Butenediol; m-C for m-cresol; and SA for salicylic aldehyde, and L-7604, L-7600, L-7230, L-7604, L-7614 and L-720 are the products manufactured by WITCO KOREA LTD.

(7)

(9)

(8)

(10)

-continued (11)

(12)

TABLE 3

Photoresist removal efficiency of remover compositions at 25°

| Specimen | A-14 | A-16 | A-18 | B-14 | B-16 | B-18 | C-14 | C-16 | C-18 |
|---|---|---|---|---|---|---|---|---|---|
| Example 1 | ○ | ○ | ○ | ○ | ○ | Δ | ○ | ○ | ○ |
| Example 2 | ○ | ○ | Δ | ○ | ○ | ○ | ○ | ○ | Δ |
| Example 3 | ○ | ○ | ○ | ○ | ○ | Δ | ○ | ○ | ○ |
| Example 4 | ○ | ○ | Δ | ○ | ○ | ○ | ○ | ○ | Δ |
| Example 5 | ○ | ○ | ○ | ○ | ○ | ○ | ○ | ○ | ○ |
| Example 6 | ○ | ○ | ○ | ○ | ○ | Δ | ○ | Δ | Δ |
| Example 7 | ○ | ○ | ○ | ○ | ○ | ○ | ○ | ○ | ○ |
| Example 8 | ○ | ○ | ○ | ○ | ○ | ○ | ○ | ○ | ○ |
| Example 9 | ○ | ○ | ○ | ○ | Δ | Δ | ○ | Δ | Δ |
| Comparative Example 1 | Δ | X | X | Δ | X | X | Δ | X | X |
| Comparative Example 2 | ○ | Δ | X | ○ | Δ | Δ | ○ | Δ | X |
| Comparative Example 3 | Δ | X | X | X | X | X | X | X | X |
| Comparative Example 4 | Δ | X | X | X | X | X | Δ | X | X |
| Comparative Example 5 | ○ | Δ | X | X | X | X | X | X | X |
| Comparative Example 6 | ○ | Δ | X | ○ | X | X | Δ | X | X |
| Comparative Example 7 | ○ | X | X | Δ | X | X | Δ | Δ | X |

TABLE 4

Photoresist removal efficiency of remover compositions at 50° C.

| Specimen | A-14 | A-16 | A-18 | B-14 | B-16 | B-18 | C-14 | C-16 | C-18 |
|---|---|---|---|---|---|---|---|---|---|
| Example 1 | ○ | ○ | ○ | ○ | ○ | ○ | ○ | ○ | ○ |
| Example 2 | ○ | ○ | Δ | ○ | ○ | ○ | ○ | ○ | Δ |
| Example 3 | ○ | ○ | ○ | ○ | ○ | ○ | ○ | ○ | ○ |
| Example 4 | ○ | ○ | Δ | ○ | ○ | ○ | ○ | ○ | Δ |
| Example 5 | ○ | ○ | ○ | ○ | ○ | ○ | ○ | ○ | ○ |
| Example 6 | ○ | ○ | ○ | ○ | ○ | Δ | ○ | Δ | Δ |
| Example 7 | ○ | ○ | ○ | ○ | ○ | ○ | ○ | ○ | ○ |
| Example 8 | ○ | ○ | ○ | ○ | ○ | ○ | ○ | ○ | ○ |
| Example 9 | ○ | ○ | ○ | ○ | Δ | Δ | ○ | Δ | Δ |
| Comparative Example 1 | Δ | X | X | Δ | X | X | Δ | X | X |
| Comparative Example 2 | ○ | Δ | Δ | ○ | ○ | Δ | ○ | Δ | Δ |
| Comparative Example 3 | Δ | Δ | X | Δ | X | X | Δ | X | X |
| Comparative Example 4 | Δ | X | X | X | X | X | Δ | X | X |
| Comparative Example 5 | ○ | ○ | Δ | X | X | X | X | X | X |
| Comparative Example 6 | ○ | Δ | X | ○ | X | X | Δ | X | X |
| Comparative Example 7 | ○ | Δ | Δ | ○ | X | X | Δ | X | X |

Referring to TABLEs 3 and 4, the photoresist remover compositions (Examples 1 through 9) according to the present invention can efficiently remove photoresist layers which have been cross-linked during the hard baking process performed at a high temperature (140~180° C.), and the dry etching, the ion-implantation and/or the ashing processes.

However, the photoresist remover compositions prepared in the Comparative Examples can efficiently remove the photoresist layers (specimens a-14, a-16 and a-18) which have not been exposed to dry etching, ion-implantation and/or ashing processes even at a low temperature (in this case, it can be seen that the removal efficiency is lowered as the hard baking temperature increases). However, it can be seen that the removal efficiency at low temperature is poor in the case of the photoresist layers (specimens B-14 through C-18) which have been cross-linked through the dry etching, the ion-implantation and/or the ashing processes.

In particular, the photoresist layer removal efficiency of the photoresist remover composition which does not contain an organic phenol compound having two or more hydroxy groups and water, in which the photoresist removal efficiency refers to the efficiency for the cross-linked photoresist layer, is the worst.

Also, the remover composition of Comparative Example 4, which contains water and a relatively excessive amount of water-soluble organic amine compound, shows poor removal efficiency for the cured and changed photoresist layer. That is, it can be seen that the photoresist removal efficiency for the cured and changed photoresist layer is poor in the case of using the photoresist removal compositions prepared in Comparative Examples which do not contain the organic phenol compound or contain the organic phenol compound having one hydroxy group. Accordingly, it can be understood from TABLEs 3 and 4 that the organic phenol compound containing two or more hydroxy groups is the most influential component in the removal of the cured and changed photoresist layer.

Figure 1A:
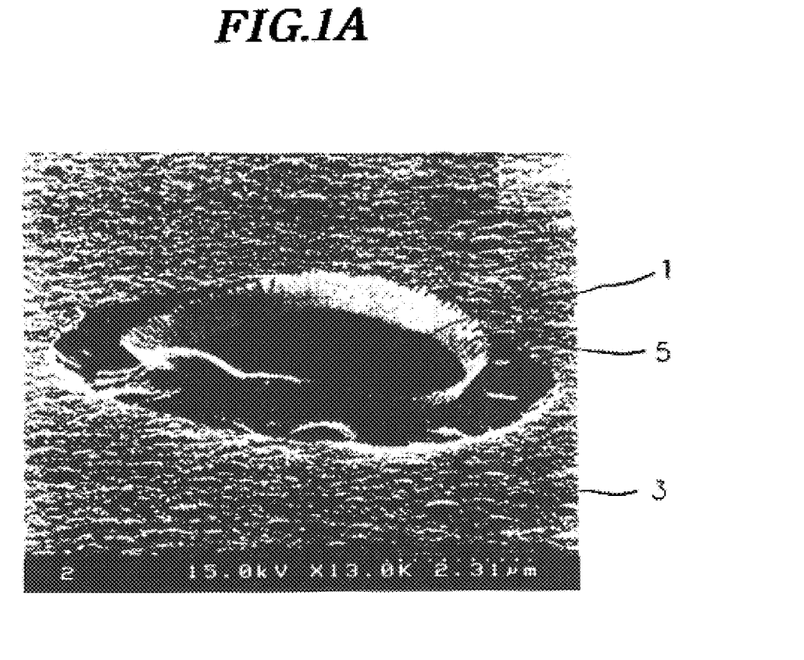
FIG. 1A is a scanning electron microscope (SEM) photo of a specimen B-16 after dry etching for forming a via hole serving as an electrical connection path with a lower metal pattern, and after an ashing process for removing most of a photoresist layer.
Figure 1B:
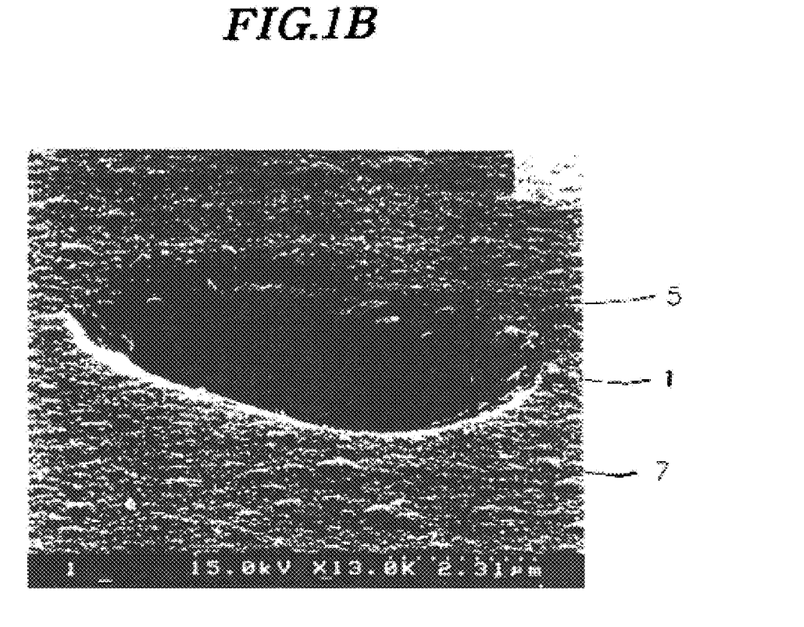
FIG. 1B is a SEM photo of a specimen B-16, showing the photoresist removal efficiency at 50° C., of a photoresist remover composition prepared in Comparative Example 3.
Figure 1C:
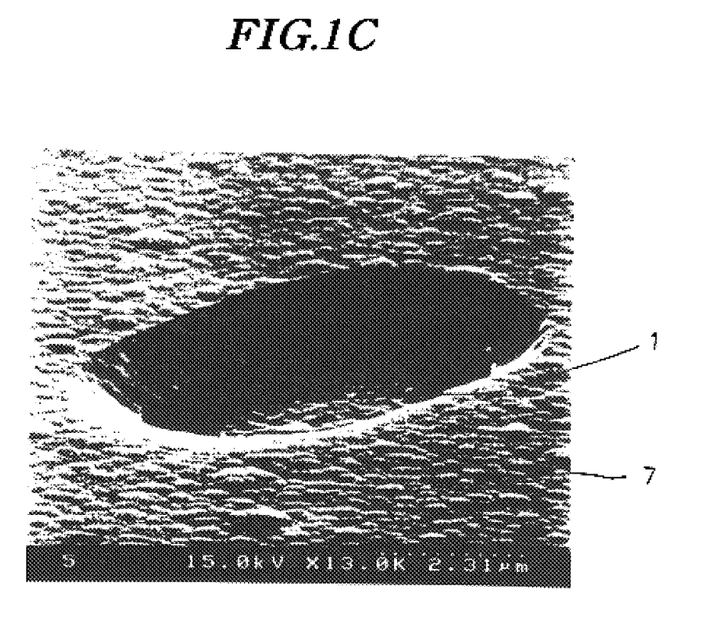
FIG. 1C is a SEM photo of a specimen B-16, showing the photoresist removal efficiency at 50° C., of a photoresist remover composition prepared in Example 6.

FIGS. 1A through 1C are microphotos obtained by using a SEM (S-4100, Hitachi Co., Japan), which comparatively show the photoresist removal efficiencies of the photoresist remover compositions of Example 6 and Comparative Example 3. The temperature of the photoresist remover composition for the specimen B-16 was 50° C.

FIG. 1A is a SEM photo of the specimen B-16, taken after dry etching for forming a via hole 1 acting as an electrical connection path to a lower metal pattern, and after the ashing process for removing most of the photoresist were performed.

Referring to FIG. 1A, a photoresist pattern 3 covering the entire specimen except for the via hole 1 and a sidewall polymer 5 formed from photoresist which has been cured and changed during the dry etching process, are shown.

FIG. 1B is a SEM photo of a specimen, showing the photoresist removal efficiency of the photoresist remover composition of Comparative Example 3 at a temperature of 50° C.

In FIG. 1B, the photoresist covering the entire surface of the specimen is removed such that an aluminum pattern 7 as a lower metal pattern is exposed. However, a part of the sidewall polymer, surrounding the via hole 1, still remains.

FIG. 1C is a SEM photo of a specimen, showing the photoresist removal efficiency of the photoresist remover composition of Example 6 at a temperature of 50° C.

In FIG. 1C, the photoresist covering the entire surface of the specimen is removed such that a lower metal pattern 7 is exposed and any sidewall polymer 5 around the via hole 1 is removed.

TABLE 5

Anti-corrosion with respect to metal pattern

| Temperature of remover composition | 50° C. | | |
|---|---|---|---|
| Soaking time | 10 minutes | 2 hours | 24 hours |
| Example 1 | ◎ | ○ | Δ |
| Example 2 | ◎ | ○ | Δ |
| Example 3 | ◎ | ◎ | ○ |
| Example 4 | ◎ | ○ | Δ |
| Example 5 | ◎ | ○ | Δ |
| Example 6 | ◎ | ◎ | ○ |
| Example 7 | ◎ | ◎ | ○ |
| Example 8 | ◎ | ◎ | ○ |
| Example 9 | ◎ | ◎ | ○ |
| Comparative Example 1 | Δ | X | X |
| Comparative Example 2 | ○ | Δ | Δ |
| Comparative Example 3 | Δ | X | X |
| Comparative Example 4 | Δ | X | X |
| Comparative Example 5 | Δ | X | X |
| Comparative Example 6 | ○ | Δ | X |
| Comparative Example 7 | Δ | X | X |

Referring to TABLE 5, the photoresist remover compositions according to the present invention (Examples 1 through 9) barely corrode a lower metal pattern during the first 2 hours of soaking. This is due to the synergic effect of the organic phenol compound containing two or more hydroxy groups and the triazole compound which both act as anti-corrosion agents. However, the photoresist remover compositions of Comparative Examples 1 through 7 start corroding a lower metal pattern at the point in time 10 minutes after the start of soaking. Also, the corrosion of the lower metal pattern become serious after 2 hours passes. Thus, using the photoresist remover compositions of the Comparative Examples to remove the photoresist increases concern about shorting of metal patterns in a semiconductor device, thereby reducing production yield, which is opposed to the case of using the photoresist remover composition according to the present invention.

Considering in detail the results shown in TABLE 5, the photoresist removal compositions of Comparative Examples 3, 5 and 7, which contain neither the organic phenol compound containing two or more hydroxy groups nor the triazole compound which act as anti-corrosion agents, cause serious corrosion to the entire surface of the lower metal pattern in addition to the sidewalls of the lower metal pattern. Thus, the degree of damage to the regularity of the pattern width is serious.

Also, the photoresist composition of Comparative Example 1 seriously corrodes the lower metal pattern even though it contains a triazole compound as an anti-corrosion component, due to its relatively high water content. In the case of using the composition of Comparative Example 1, which has been prepared by adding a triazole compound to the composition of Comparative Example 5, the degree of corrosion on the surface of the lower metal pattern decreases while partial corrosion at the sidewalls, i.e., the pitting phenomenon, is still serious.

Figure 2A:
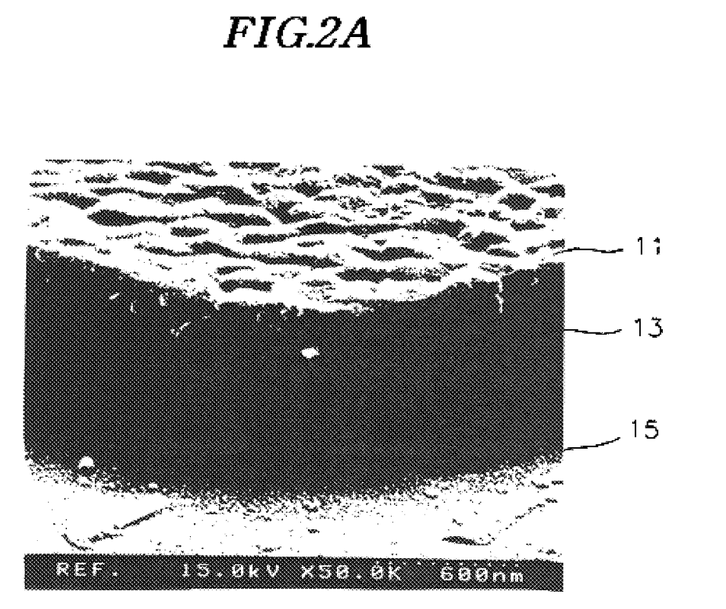
FIG. 2A is a SEM photo of a specimen D-12 after dry etching for forming a via hole serving as an electrical connection path with a lower metal pattern, and after an ashing process for removing most of a photoresist layer.
Figure 2B:
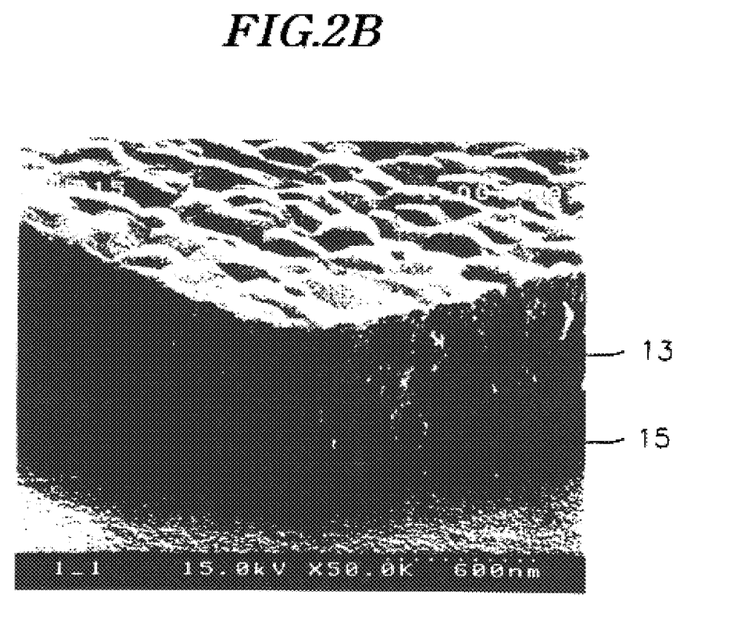
FIG. 2B is a SEM photo of a specimen D-12 which has been soaked in a photoresist remover composition of Comparative Example 5 at 50° C. for 2 hours to test the anti-corrosion property with respect to the metal pattern.
Figure 2C:
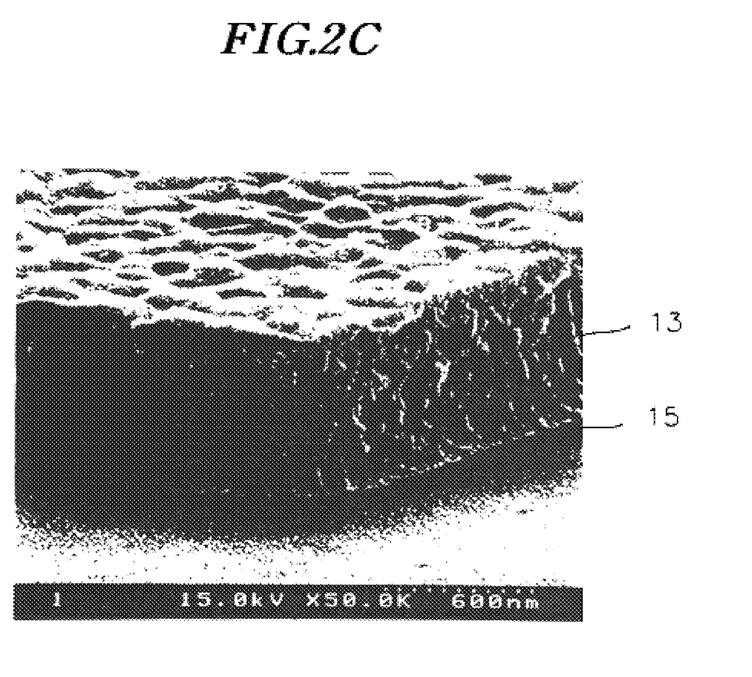
FIG. 2C is a SEM photo of the specimen D-12 which has been soaked in a photoresist remover composition of Example 8 at 50° C. for 2 hours to test the anti-corrosion property with respect to the metal pattern.

FIGS. 2A through 2C are SEM (S-4100, Hitachi Co., Japan) photos, showing the anti-corrosion effect of the photoresist remover compositions of Example 8 and Comparative Example 5 with respect to the metal pattern. Here, the anti-corrosion test was performed on the specimen D-12.

In detail, FIG. 2A is a SEM photo of the specimen D-12 after dry etching for forming a via hole acting as an electrical connection path to a lower metal pattern and the ashing process for removing most of the photoresist are performed. In FIG. 2A, a titanium pattern 15 and an aluminum pattern 13 formed on a substrate, as lower metal pattern, and a photoresist pattern 11 covering these patterns are shown.

FIG. 2B is a SEM photo of a specimen which was soaked in the photoresist remover composition of Comparative Example 5 at 50° C. for 2 hours to test the anti-corrosion property thereof. As shown in FIG. 2B, the photoresist 11 covering the aluminum pattern shown in FIG. 2A was removed such that the lower aluminum pattern 13 was exposed, and serious corrosion of the sidewalls and the surface of the aluminum pattern 13 was detected.

FIG. 2C is a SEM photo of a specimen which was soaked in the photoresist remover composition of Example 8 at 50° C. for 2 hours to test the anti-corrosion property thereof. As shown in FIG. 2C, the photoresist 11 covering the aluminum shown in FIG. 2A was removed such that the lower aluminum pattern 13 was exposed. However, the sidewall and the surface of the aluminum pattern 13 were scarcely corroded.

TABLE 6

Eluting amount of metal ions (unit: ppb)

| Temperature of remover composition | 50° C. | | | |
|---|---|---|---|---|
| Soaking time | 0 | 12 hours | 24 hours | 48 hours |
| Example 1 | 1 | 3 | 19 | 35 |
| Example 2 | 1 | 3 | 17 | 36 |
| Example 3 | 1 | 2 | 16 | 29 |
| Example 4 | 2 | 3 | 19 | 37 |
| Example 5 | 1 | 4 | 21 | 41 |
| Example 6 | 1 | 3 | 16 | 32 |
| Example 7 | 2 | 3 | 15 | 34 |
| Example 8 | 1 | 5 | 15 | 35 |
| Example 9 | 1 | 1 | 17 | 33 |
| Comparative Example 1 | 1 | 35 | 69 | 145 |
| Comparative Example 2 | 1 | 19 | 42 | 210 |
| Comparative Example 3 | 2 | 24 | 39 | 109 |
| Comparative Example 4 | 1 | 25 | 45 | 167 |
| Comparative Example 5 | 1 | 42 | 63 | 231 |
| Comparative Example 6 | 2 | 28 | 45 | 114 |
| Comparative Example 7 | 2 | 31 | 48 | 121 |

Referring to TABLE 6, in the cases of using the photoresist remover compositions (Examples 1 through 9) according to the present invention, the eluting amount of aluminum ions scarcely changes until 12 hours has passed. That is, it can be understood that the lower metal pattern scarcely corrodes during soaking for 12 hours. On the contrary, in the cases of using the photoresist remover compositions of Comparative Examples 1 through 7, the eluting amount of aluminum ions is about 10 times more, on average, than the cases of using the compositions of Examples according to the present invention, causing serious corrosion to the lower metal pattern.

The reason for the serious corrosion is that the photoresist removal compositions of Comparative Examples 1 through 7 do not contain an organic phenol compound having two or more hydroxy groups and a triazole compound which act anti-corrosion agents unlike the photoresist removal compositions of Examples 1 through 9 containing the anti-corrosion agents, which has been described with reference to TABLE 5.

TABLE 7

Number of redeposited photoresist particles (unit: number)

| Number of | Specimen B-14 | | Specimen C-14 | |
|---|---|---|---|---|
| processed specimens | Example 7 | Comparative Example 3 | Example 7 | Comparative Example 3 |
| 1 | 0 | 0 | 0 | 0 |
| 100 | 2 | 13 | 3 | 17 |
| 200 | 4 | 38 | 4 | 42 |
| 300 | 8 | 67 | 7 | 71 |
| 400 | 11 | 143 | 12 | 138 |

As shown in TABLE 7, in the photoresist removal composition of Comparative Example 3, the number of photoresist residue particles redeposited on the substrate is about 10 times greater that in the photoresist composition of Example 7.

The reason for this appears to be that the composition of Example 7 contains a silicone surfactant expressed as the chemical formula (6) while the composition of Comparative Example 3 contains an ethylene glycol non-ionic surfactant.

As described above, the photoresist remover compositions according to the present invention can easily remove, at a low temperature and in a short time, a photoresist layer which has been cured during the dry etching, the ashing and the ion-implantation processes and changed by a metallic contaminants which are shed from the lower metal layer. Also, the corrosion of the lower metal pattern, in particular, side pitting of the lower metal pattern, during the removal of the photoresist, can be minimized and the separation and redeposition of photoresist which has been dissolved in the photoresist remover composition can be minimized. Also, it is possible to use only water for the next rinsing process instead of using an organic solvent such as isopropyl alcohol or dimethylsulfoxide.

What is claimed is:

1. A photoresist remover composition comprising:
    10~40 wt % of water-soluble amine compound;
    20~50 wt % of at least one water-soluble polar organic solvent selected from the group consisting of dimetylsulfoxide (DMSO), N-methylpyrrolidone (NMP), dimethylacetamide (DMAc), dimethylformamide (DMF) and dimethylimidezolidinone (DMI);
    10~30 wt % of water;
    0.1~10 wt % of organic phenol compound containing two or more hydroxy groups;
    0.1~10 wt % of triazole compound; and
    0.01~1 wt % of silicone surfactant.

2. The photoresist remover composition of claim 1, wherein the water-soluble organic amine compound is an amino alcohol compound.

3. The photoresist remover composition of claim 2, wherein the amino alcohol compound is at least one selected from the group consisting of 2-amino-1-ethanol, 1-amino-2-propanol, 2-amino-1-propanol, 3-amino-1-propanol, 2-amino-1-butanol and 4-amino-1-butanol.

4. The photoresist remover composition of claim 1, wherein the organic phenol compound containing two or more hydroxy groups is a bisphenol compound expressed as the following chemical formula (1):

(1)

wherein $R_1$s are independently selected from $C_1$ to $C_4$ alkyl or $C_1$ to $C_4$ alkoxy; $R_2$s are independently selected from hydrogen, $C_1$ to $C_4$ alkyl or $C_1$ to $C_4$ alkoxy; $m_1$ and $m_2$ are integers from 1 to 3; and $n_1$ and $n_2$ are integers from 0 to 3.

5. The photoresist remover composition of claim 1, wherein the organic phenol compound containing two or more hydroxy groups is a hydroxybenzophenone compound expressed as the following chemical formula (2):

(2)

wherein $R_1$s are independently selected from $C_1$ to $C_4$ alkyl or $C_1$ to $C_4$ alkoxy; $m_1$ and $m_2$ are integers from 1 to 3; and $n_1$ and $n_2$ are integers from 0 to 3.

6. The photoresist remover composition of claim 1, wherein the organic phenol compound containing two or more hydroxy groups is a trisphenol compound expressed as the following chemical formula (3):

(3)

wherein $R_1$s are independently selected from $C_1$ to $C_4$ alkyl or $C_1$ to $C_4$ alkoxy; $R_2$ is hydrogen, $C_1$ to $C_4$ alkyl or $C_1$ to $C_4$ alkoxy; $m_1$ through $m_3$ are integers from 1 to 3; and $n_1$ through $n_3$ are integers from 0 to 3.

7. The photoresist remover composition of claim 1, wherein the organic phenol compound containing two or more hydroxy groups is a compound expressed as the following chemical formula (4):

(4)

wherein $R_1$s are independently selected from $C_1$ to $C_4$ alkyl or $C_1$ to $C_4$ alkoxy; $R_2$, $R_3$ and $R_4$ are each independently selected from $C_1$ to $C_4$ alkyl or $C_1$ to $C_4$ alkoxy; $m_1$ through $m_3$ are integers from 1 to 3; and $n_1$ through $n_3$ are integers from 0 to 3.

8. The photoresist remover composition of claim 1, wherein the organic phenol compound containing two or more hydroxy groups is a compound expressed as the following chemical formula (5):

(5)

wherein $R_1$s are independently selected from $C_1$ to $C_4$ alkyl or $C_1$ to $C_4$ alkoxy; k is an integer from 0 to 3; $m_1$ through $m_7$ are integers from 1 to 3; and $n_1$ through $n_4$ are integers from 0 to 3.

9. The photoresist remover composition of claim 1, wherein the triazole compound is at least one selected from the group consisting of benzotriazole (BT), tolyltriazole (TT), carboxylic benzotriazole (CBT), 1-hydroxybenzotriaxole (HBT) and nitrobenzotriazole (NBT).

10. The photoresist remover composition of claim 1, wherein the silicone surfactant is a compound expressed as the following chemical formula (6):

wherein x is an integer from 0 to 10, y is an integer from 1 to 10, m is an integer from 0 to 10, n is an integer from 1 to 10, EO represents ethyleneoxy group, PO represents 1,2-propyleneoxy group, and Z represents halogen or alkyl group.

* * * * *